United States Patent [19]

Kakinuma

[11] 4,157,482
[45] Jun. 5, 1979

[54] ROTATION DETECTING DEVICE
[75] Inventor: Mikio Kakinuma, Abikoshi, Japan
[73] Assignee: Niles Parts Co., Ltd., Japan
[21] Appl. No.: 856,586
[22] Filed: Dec. 1, 1977
[30] Foreign Application Priority Data Jan. 20, 1977 [JP] Japan .................. 52-005660[U]

[51] Int. Cl.² ................................... H02K 21/38
[52] U.S. Cl. ..................... 310/155; 310/156; 310/168
[58] Field of Search .......... 148/103, 108, 120, 31.57; 123/146.5 A, 148 E; 310/152, 155, 156, 168, 111; 365/133

[56] References Cited

U.S. PATENT DOCUMENTS

| | | | |
|---|---|---|---|
| 3,279,959 | 10/1966 | Oshima et al. | 148/103 |
| 3,757,754 | 9/1973 | Wiegand | 123/146.5 A |
| 3,780,313 | 12/1973 | Wiegand | 310/168 X |
| 3,818,465 | 6/1974 | Wiegand | 365/133 |
| 3,820,090 | 6/1974 | Wiegand | 148/120 |
| 3,866,193 | 2/1975 | Wiegand | 365/133 |
| 3,892,118 | 7/1975 | Wiegand | 365/133 |

Primary Examiner—Donovan F. Duggan
Attorney, Agent, or Firm—Lane, Aitken & Ziems

[57] ABSTRACT

A compact rotation detecting device in which a rotor providing a set and a reset permanent magnets, a disk providing a plurality of wires having Wiegand effect in the radial direction of the disk, and spiral coils mounted on plural insulating disks are assembled in a housing case in a stack fashion, the spiral coils being automatically connected in series by the assembly, and upon rotation of the rotor pulse frequency proportional to the amount of the rotor's rotation being derived from the series connection of the spiral coils.

5 Claims, 6 Drawing Figures

ROTATION DETECTING DEVICE

BACKGROUND OF THE INVENTION

1. Field of the Invention

The present invention relates a device for detecting the rotation of a rotating body. 2. Description of the Prior Art A conventional device for detecting the rotation of a rotating body has been constructed in complex, so that it is very difficult to automatically assemble the device by such as a robot thereby resulting in expensiveness for mass production.

SUMMARY OF THE INVENTION

It is an object of the present invention to provide a rotation detecting device having a compact size and a simple construction, which is inexpensive to manufacture.

Another object of the present invention is to provide a rotation detecting device which can be automatically assembled by a robot.

Other and further object, features and advantages of the present invention will appear more fully from the following description.

DESCRIPTION OF THE PREFERRED EMBODIMENTS

Figure 1:
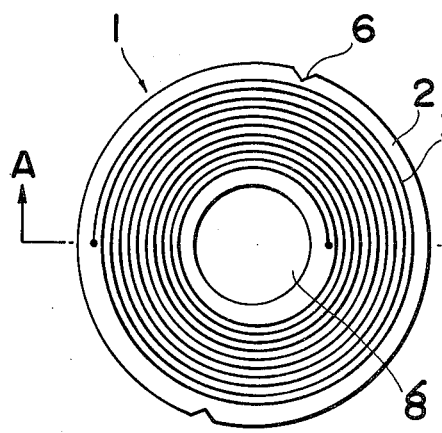
FIG. 1 is a plan view of a coil block of the present invention.
Figure 3:
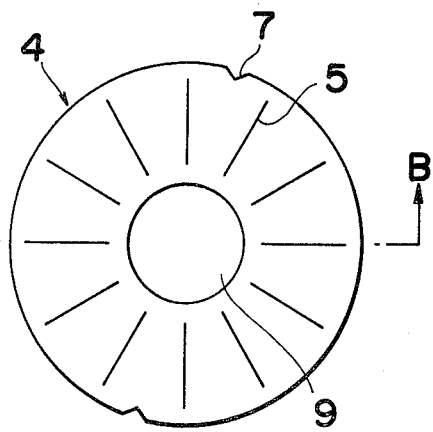
FIG. 3 is a plan view of a disk with wires having Wiegand effect which are arranged in radial direction.
Figure 2:
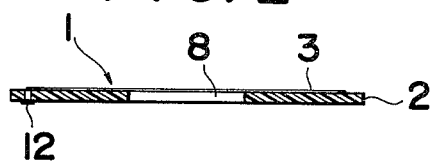
FIG. 2 is a section taken on line A—A in FIG. 1.
Figure 4:
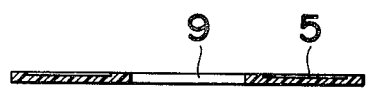
FIG. 4 is a section taken on line B—B in FIG. 3.
Figure 5:
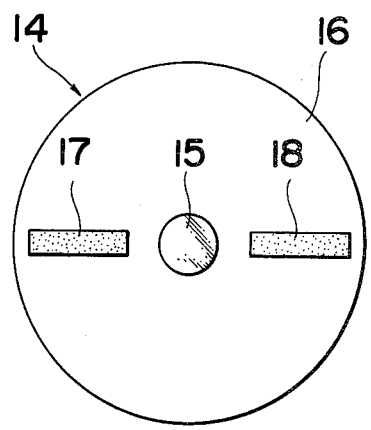
FIG. 5 is a plan view of a rotor used for the device of the present invention.

In the drawings numeral 1 designates a coil block comprising an insulating plate 2 and a spiral coil 3 mounted on the insulating plate 2. The spiral coil 3 may be composed of a copper foil or a thin conductive strip printed on the insulating plate 2. Numeral 4 designates a disk with wires 5 having Wiegand effect, which wires 5 being arranged in the radial direction of the disk 4. The wire 5 having Wiegand effect is made from permalloy and pickalloy by means of a special method. The wire 5 has a double magnetic pole construction on the peripheral surface portion and in the interior portion of the wire 5. Namely, on the peripheral surface portion the magnetic poles N and S are located along the axis of the wire 5 whereas in the interior portion thereof the other magnetic poles N and S are located along the axis of the wire 5 in such manner that the N and S poles at the peripheral surface portion are respectively opposite to the S and N poles at the interior portion thereof. The wire 5 with Wiegand effect has a characteristic that the magnetic poles located at the interior portion is abruptly inverted in opposit polarity by approaching of other magnetic material against the wire 5. Further pulse current can be derived from a coil located in the direction perpendicular to the direction of magnetic polarity of the wire 5 having Wiegand effect.

The coil block 1 and the disk 4 provided with a plurality of the wires 5 having Wiegand effect in the radial direction of the disk 4 are constructed plane disk, and they are provided with central holes 8 and 9 and position adjusting cavities 6 and 7 respectively.

Numeral 10 designates a housing case for receiving the single disk 4 having the wires 5 and a plurality of the coil blocks 1, and the housing case 10 has a bearing 11 at the central portion thereof for receiving a shaft 15.

The coil blocks 1 and the disk 4 are stacked in the housing case 10 such that the holes 8 and 9 of the coil blocks 1 and the disk 4 are inserted into the bearing 11, where each of the spiral coils 3 mounted on the insulating plates 2 of the coil blocks 1 is electrically connected in series. The one end of the spiral coil 3 is electrically connected to an electrode 12 which is extended to the opposit surface of the insulating plates 2 in order to make contact the electrode 12 with the one end of the other spiral coil mounted on the other coil block adjecent to the coil block 1.

The other end of the spiral coil 3 is adapted to be connected to the electrode 12 mounted on the other coil block.

Accordingly the spiral coils 3 can be connected in series when the coil blocks 1 are stacked in the housing case 10 by means of the provision of a cavity or recess portion 6 provided at the peripheral portion of the insulating plate 2 and a projected portion (not shown) which is mounted on the inner surface of the housing case 10 to fit with the recess portion 6 of the insulating plate 2.

Figure 6:
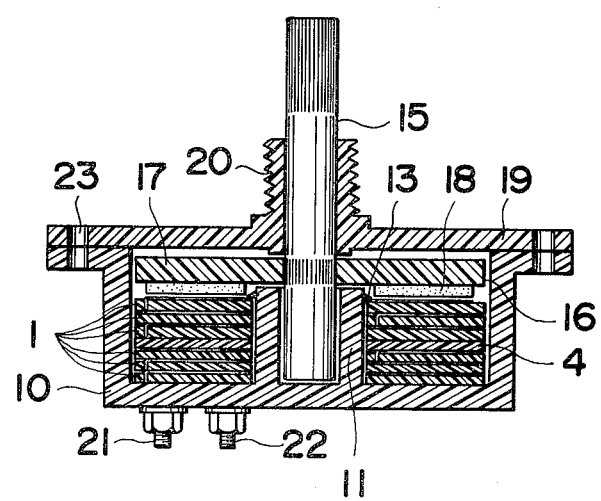
FIG. 6 is a section showing a preferred embodiment for the rotation detecting device of the present invention.

In FIG. 6, the disk 4 providing a plurality of the wires 5 having Wiegand effect in the radial direction of the disk 4 is sandwiched between the coil blocks 1, but the disk 4 may be located at the top or the bottom of the stack construction in the housing case 10. In the case where the disk 4 is sandwiched between the coil blocks 1, electrodes (not shown) are must be mounted on the disk 4 providing the plural wires 5 having Wiegand effect in the radial direction of the disk 4, through from the front surface to the back surface of the disk 4 in order to connect the spiral coils 3 in series by the electrodes.

In the housing case 10, the disk 4 with the wires 5 having Wiegand effect and the coil blocks 1 are fixed by insertion of a ring 13 mounted on the bearing 11 in order to make a correctly electrical connection of the spiral coils 3 and a stable fixation therebetween.

Numeral 14 designate a rotor comprising a shaft 15, a rotary disk 16 fixed to the shaft 15, a set magnet 17, and a reset magnet 18. The magnets 17 and 18 are parmanent magnets.

The shaft 15 fixed to the rotor 14 is rotatably supported by the bearing 11 and another bearing 20 mounted on a lid 19 used for the housing case 10. Numeral 23 shows a screw hole for fastening between the lid 19 and the housing case 10. Numerals 21 and 22 are electric terminals provided on the bottom surface of the housing case 10. At the position, the terminals 21 and 22 can automatically contact to both ends of the series connection consisted of the spiral coils 3 when plural coil blocks 1 are correctly received in the housing case 10 in accordance with cooperation of the recess portion 6 and the projected portion of the housing case.

Referring now to assembly of the rotation detecting device as mentioned above, plural coil blocks 1 as well as the disk 4 with wires having Wiegand effect are received in the housing case 10, and they are fixed by insertion of the ring 13 to the bearing 11, then the rotary shaft 15 with the disk 4 being received at the bearing 11, the opening the housing case being covered by the lid 19, and both of the housing case 10 and the lid 19 being finally fastened together. In such assemble process the spiral coils 3 of the coil blocks 1 are connected in series and the both ends of the series connection consisted of the spiral coils 3 are automatically connected to the terminals 21 and 22 respectively.

Thus by such comparatively simple assemble process of inserting the above elements into the housing case, all of electrical connection among the spiral coils and the terminals are automatically achieved, which results in a simple assembly and an automatic assembly by a robot.

In the above embodiment, the set and reset magnets 17 and 18 are mounted on the surface of the rotary disk 16 by a suitable adhesine material, but they may be embedded. Each of the coil blocks 1 may be composed of a stack of printed wiring boards each board of which has the printed wiring of the spiral coil 3 thereon thereby to be able to reduce a vertical size of the rotation detecting device.

Referring now to the operation of the rotation detecting device, upon rotation of the rotor 14 in accordance with the shaft's rotation, the set and reset magnets 17 and 18 are atternately approached to and removed from each of the wires 5 having Wiegand effect. By this, the porality of the magnet located at the interior portion of the wire 5 is abruptly inverted in opposite porality by approaching of the set magnet 17 and is abruptly returned to the previous porality of the interior magnet by approaching of the reset magnet 17 to each of the wires 5. By such an abrupt change of porality, pulse current is produced in the spiral coils 3 and the pulse frequency can be derived from the terminals 21 and 22.

The number of pulse by each one rotation of the rotor 14 is proportional to the number of the set and reset magnets 17 and 18 as well as the number of the wires 5 mounted on the disk 4 in the radial direction thereof. Therefore, number of the pulse can be easily increased by a simple modification or increment of the set and reset magnets and the wire having Wiegand effect.

As is apparent from the above description, the rotation detecting device of the present invention has following advantages:

(a) The rotation detecting device can be easily assembled by sequential insertion of the coil blocks 1, the disk 4 with the wires 5 having Wiegand effect, the ring 13 fixing the coil blocks 1 and the disk 4, and the rotor 14, which results in facility of automatic assembly by robot and in reduction of manufacturing cost by mass production.

(b) The spiral coils 3 are automatically connected in series by simple stack of the coil blocks 1 in the housing case 10, which results in a very simple wiring.

(c) By simple insertion of the ring 13 to the bearing 11, the coil blocks 1 and the disk 4 with wires 5 having Wiegand effect are easily and stably fixed to the bearing 11 in the housing case 10, which results in high reliability of the electric connection between the spiral coils 3.

(d) The coil block 1 and the disk 4 with wire 5 having Wiegand effect have the recess portion 6 for aligning the coil block 1 and the disk 4, and the housing case 10 has the projected portion to fit with the recess portion 6, as that each of the spiral coils 3 is correctly connected to each other in series.

(e) The spiral coil can be easily manufactured such that a slight strip of copper foil is deposited on an insulating disk by a suitably adhesive material in a spiral shape, or the spiral coil can be easily composed of a printed wiring board thereby to make automatic the manufacture of the coil blocks with the spiral coils.

(f) By configuration of the coil block composed of a stack of printed wiring board having a printed spiral coil, the vertical size of the rotation detection device can be compactly reduced.

What is claimed is:

1. A rotation detecting device comprising a housing case, a lid of said housing case, a rotor having a set and a reset permanent magnets and a shaft for rotating said rotor, a disk providing a plurality of wires having Wiegand effect in the radial direction of said disk, coil blocks having an insulating plate mounting spiral coils for producing a pulse current by operation of said wires having Wiegand effect upon the rotation of said rotor, and terminals mounted on said insulating plate of said coil block and extended from a first surface on which said spiral coil is mounted to a second surface opposit to said first surface of said insulating plate for automatically connecting said spiral coils on said coil blocks in series upon assembly of said coil blocks by insertion of said coil blocks into said housing case.

2. A rotation detecting device according to claim 1, further comprising a ring to be mounted to the bearing mounted in said housing case and used for said shaft, which ring acting as a fastener for fastening said disk having wires and said coil blocks with said housing case thereby to increase the electric connection between said spiral coils and said terminals.

3. A rotation detecting device according to claim 1, further comprising cavities provided at peripheral portions of said disk having said wires and said coil blocks for achieving a predetermined alignment between said disk having said wires and said coil blocks in order to correctly contact said spiral coils with said terminals on said insulating plates and a projected portion provided on the inner surface of said housing case for contacting said cavities of said disk having said wires and said coil blocks with said projected portion thereby to achieve said predetermined alignment between said disk having said wire and said coil blocks.

4. A rotation detecting device according to claim 1, wherein said spiral coil is comprised of a slight strip of copper foil deposited on said insulating plate by a suitably adhesive material in a spiral shape.

5. A rotation detecting device according to claim 1, wherein said spiral coil is comprised of a thin conductive strip printed and wired on an insulating board as a printed wiring board.

* * * * *